(12) United States Patent
Guz et al.

(10) Patent No.: US 9,514,802 B2
(45) Date of Patent: Dec. 6, 2016

(54) VOLATILE MEMORY SELF-DEFRESH

(71) Applicants: Zvi Guz, Palo Alto, CA (US); Liang Yin, San Jose, CA (US)

(72) Inventors: Zvi Guz, Palo Alto, CA (US); Liang Yin, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/668,927

(22) Filed: Mar. 25, 2015

(65) Prior Publication Data

US 2016/0118104 A1 Apr. 28, 2016

Related U.S. Application Data

(60) Provisional application No. 62/069,279, filed on Oct. 27, 2014.

(51) Int. Cl.
| | |
|---|---|
| *G11C 7/00* | (2006.01) |
| *G11C 11/4078* | (2006.01) |
| *G11C 11/4091* | (2006.01) |
| *G11C 11/4072* | (2006.01) |
| *G11C 11/4094* | (2006.01) |

(52) U.S. Cl.
CPC ........ *G11C 11/4078* (2013.01); *G11C 11/4072* (2013.01); *G11C 11/4091* (2013.01); *G11C 11/4094* (2013.01)

(58) Field of Classification Search
CPC ............. G11C 11/4087; G11C 11/4094; G11C 11/4091; G11C 11/4078
USPC ........................................................ 365/203
See application file for complete search history.

(56) References Cited

U.S. PATENT DOCUMENTS

| | | | |
|---|---|---|---|
| 8,331,189 B1 | 12/2012 | Pancoast et al. | |
| 8,438,358 B1* | 5/2013 | Kraipak | G11C 7/04 327/512 |
| 8,467,230 B2 | 6/2013 | Behrends et al. | |
| 2006/0288154 A1 | 12/2006 | Huang et al. | |
| 2010/0332718 A1* | 12/2010 | Farrell | G06F 13/1647 711/5 |
| 2012/0110238 A1 | 5/2012 | Blawat | |
| 2012/0176853 A1* | 7/2012 | Kim | G11C 11/40611 365/222 |
| 2012/0233394 A1* | 9/2012 | Liu | G06F 12/0804 711/105 |
| 2014/0068203 A1* | 3/2014 | Son | G11C 11/4076 711/155 |
| 2014/0089574 A1* | 3/2014 | Sohn | G11C 7/1054 711/105 |

\* cited by examiner

*Primary Examiner* — Toan Le
(74) *Attorney, Agent, or Firm* — Renaissance IP Law Group LLP (57) ABSTRACT

Embodiments of the inventive concept include a volatile memory device including a memory cell array, the memory cell array including multiple rows and/or banks to store data. The memory device can include an address decoder coupled to the memory cell array. The memory device can include a control logic section coupled to the address decoder. The control logic section can include a defresh logic section configured to intentionally violate, by an activate command, a row precharge time ($T_{RP}$) and/or a row active time ($T_{RAS}$) for each of the plurality of rows to clean the data from the memory cell array. Memory data can be cleaned from the memory cell array responsive to the violations.

20 Claims, 9 Drawing Sheets

VOLATILE MEMORY SELF-DEFRESH

RELATED APPLICATION DATA

This application claims the benefit of U.S. patent application Ser. No. 62/069,279, filed Oct. 27, 2014, which is hereby incorporated by reference.

BACKGROUND

The present inventive concept relates to volatile memories, and more particularly, to a device, system, and method for defreshing data on a volatile memory such as a dynamic random access memory (DRAM) in connection with a reset or power cycle.

Contrary to popular belief, DRAM does not lose all data instantaneously after power loss, but rather it retains the data for between several seconds to several minutes. Such behavior facilitates myriad attacks such as a "cold-boot attack" that can target the memory image and allow an attacker to surreptitiously obtain partial or full contents of the memory.

For example, if a user uses encryption programs to encrypt a hard drive or magnetic disk storage, such programs encrypt the entire drive and use DRAM to save the encryption key during online operation. An attacker can steal the user's laptop while still powered-on, spray the DRAM memory module with a cooling spray that is easily accessible from most home goods stores, pull out the memory module, put it in a different computer machine, and then read the entire memory image out of it. It is now relatively straight forward for the attacker to guess which of all the DRAM data is the encryption key. Once the attacker has the encryption key he can obtain full access to the user's encrypted hard drive. This attack can be executed by a moderately sophisticated attacker with no special equipment. Embodiments of the present inventive concept address these and other limitations in the prior art.

BRIEF SUMMARY

Embodiments of the inventive concept include a volatile memory device, which can include a memory cell array including a plurality of rows configured to store data, an address decoder coupled to the memory cell array, and a control logic section coupled to the address decoder. The control logic section can include a defresh logic section configured to violate, by an activate command, a row precharge time ($T_{RP}$) for each of the plurality of rows to clean the data from the memory cell array responsive to a memory reset or a memory power-on. The defresh logic section can include a defresh counter that is configured to begin counting a time T at substantially a start time of the $T_{RP}$ and end counting the time T before an end time of the $T_{RP}$. The address decoder can update a row address associated with one of the plurality of rows responsive to an expiration of the time T. The control logic section can cause the activate command to violate the $T_{RP}$ after the row address is updated and responsive to the expiration of the time T. The time T can be less than (i.e., shorter than) the time $T_{RP}$.

Embodiments of the inventive concept include computer-implemented method for defreshing a volatile memory. The method can include storing data in a plurality of rows of a memory cell array of the volatile memory. The method can include detecting at least one of a memory power-on or a memory reset of the volatile memory. The method can include initiating a reset procedure responsive to the detecting. The method can include initializing the volatile memory responsive to the reset procedure, wherein initializing includes defreshing, by a defresh logic section, the plurality of rows of the memory cell array of the volatile memory. Defreshing can include violating, by an activate command, a row precharge time ($T_{RP}$) for each of the plurality of rows, and cleaning the data from the plurality of rows of the memory cell array responsive to the violations.

Embodiments of the inventive concept can include another computer-implemented method for defreshing a volatile memory. The method can include storing data in a plurality of rows of a memory cell array of the volatile memory. The method can include detecting at least one of a memory power-on or a memory reset of the volatile memory. The method can include initiating a reset procedure responsive to the detecting. The method can include initializing the volatile memory responsive to the reset procedure, wherein initializing includes defreshing, by a defresh logic section, the plurality of rows of the memory cell array of the volatile memory.

Defreshing can include activating a first row from among the plurality of rows. Defreshing can include beginning a first row active time ($T_{RAS}$) at substantially a same time as activating the first row, activating a second row from among the plurality of rows before an end time of the first $T_{RAS}$ and before a precharge is initiated for the first row, violating, by the second row activation, the first $T_{RAS}$, activating a third row from among the plurality of rows before an end time of a second $T_{RAS}$ and before a precharge is initiated for the second row, violating, by the third row activation, the second $T_{RAS}$, and cleaning the data from the plurality of rows of the memory cell array responsive to the violations.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments of the inventive concept include a lightweight technique that renders impractical any cold-boot attacks and related attacks on volatile memories, while having no performance or power impacts on regular user operation. The volatile memories can include DRAM, synchronous DRAM (SDRAM), double data rate DRAM (DDR-DRAM), or the like. It will be understood that embodiments of the inventive concept described herein can be used with any suitable volatile memory, although for the sake of simplicity and clarity, reference is generally made to such volatile memory herein as simply "DRAM." An altered DRAM self-refresh logic is provided to implement a complete DRAM cleansing, referred to herein as a defresh. A DRAM RESET signal can trigger the DRAM defresh. Any power-on event or system reset can trigger the DRAM reset, which can be the first step for the DRAM training based on, for example, double data rate (DDR) specifications. A DRAM defresh can be executed on every DRAM reset process. The DRAM defresh can be completed before the DRAM starts accepting new commands. The reset including the defresh is completed within the allowed reset process time interval, and thus respects timing constraints such as the DDR4 Joint Electron Device Engineering Council (JEDEC) timing constraints. The defresh technique ensures that all data previously held in the DRAM is lost, thereby thwarting cold-boot attacks.

Figure 1:
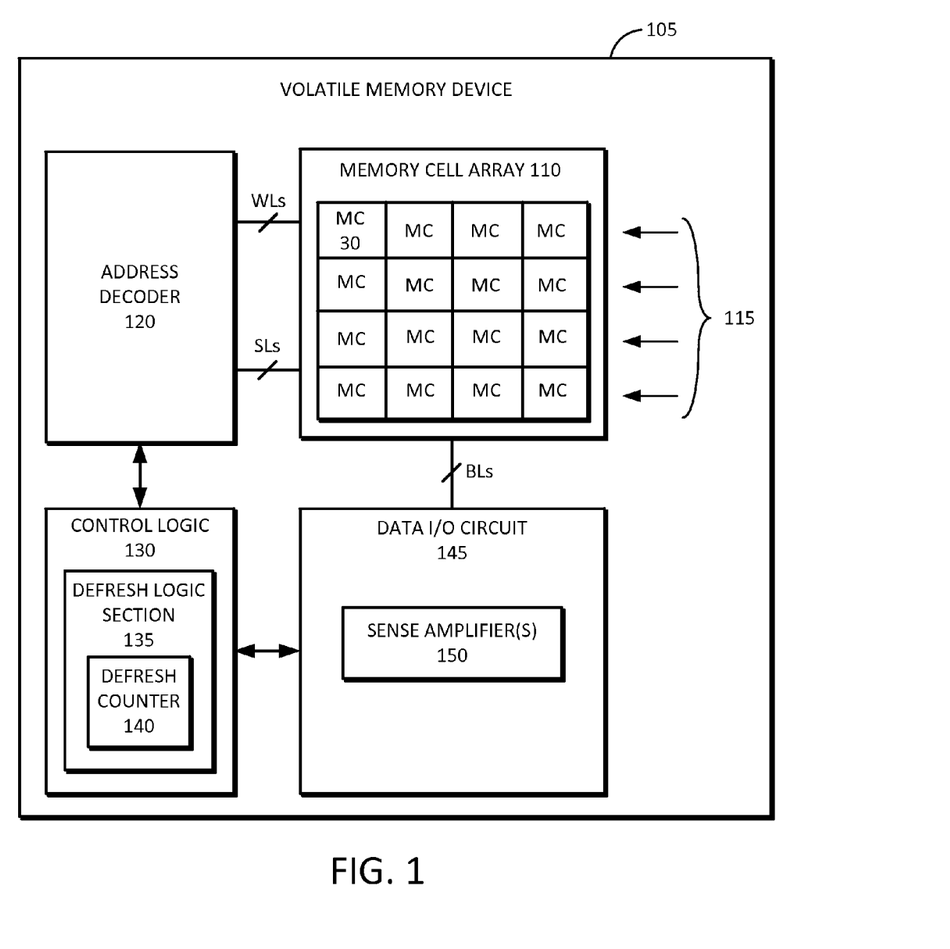
FIG. 1 is an example block diagram of a volatile memory device including control logic having defresh logic in accordance with embodiments of the inventive concept.

FIG. 1 is an example block diagram of a volatile memory device 105 including control logic section 130 having defresh logic section 135 in accordance with embodiments of the inventive concept. The memory device 105 includes a memory cell array 110, a data I/O circuit 145, an address decoder 120, and a control logic section 130. The data I/O circuit 145 can include sense amplifier circuitry 150 for sensing or reading bit information stored in memory cell array 110.

The memory cell array 110 can have a plurality of memory cells MC 30, each of which stores one or more data bits. The memory cells MC can be connected to a plurality of word lines WLs, a plurality of source lines SLs, and a plurality of bit lines BLs. The bit lines BLs can be arranged to intersect with the word lines WLs.

The memory cells 30 can be arranged at intersection portions (not shown) between the word lines and the bit lines. The memory cells 30 can be grouped into memory rows (e.g., rows 115). The rows 115 can be grouped in memory blocks. For example, for a 1 Mb memory block, one thousand (1000) word lines and one thousand (1000) bit lines can be associated with the memory block. Thus, each bit line associated with such a block would have one thousand (1000) memory cells associated therewith. It will be understood, however, that any suitable number of word lines, bit lines, and/or memory cells can be associated with each block.

The address decoder 120 can be connected to the memory cell array 110 via the word lines WLs and source lines SLs. The address decoder 120 can operate responsive to the control of the control logic section 130. The address decoder 120 can decode an input address to select the word lines WLs and source lines SLs. The address decoder 120 can receive power (e.g., a voltage or a current) from the control logic section 130 to provide it to a selected or unselected word line.

The data input/output circuit 145 can be connected to the memory cell array 110 via the bit lines BLs. The data input/output circuit 145 can operate responsive to the control of the control logic section 130. The data input/output circuit 145 can select a bit line in response to a bit line selection signal (not shown) from the address decoder 120. The data input/output circuit 145 can receive power (e.g., a voltage or a current) from the control logic section 130 to provide it to a selected bit line.

The control logic section 130 can be configured to control an overall operation of the memory device 105. The control logic section 130 can be supplied with external power and/or control signals. The control logic section 130 can generate power needed for an internal operation using the external power. The control logic section 130 can control read, write, and/or erase operations in response to the control signals.

The control logic section 130 can include a defresh logic section 135. The defresh logic section 135 can be configured to violate a row precharge time ($T_{RP}$) and/or a row active time ($T_{RAS}$) for each of the memory rows 115 to clean the data from the memory cell array responsive to a memory reset or memory power-up, as further described in detail below. The defresh logic section 135 can include a defresh counter 140. The defresh logic section 135 can use the defresh counter 140 to cut short the $T_{RP}$ and/or a $T_{RAS}$, thereby cleaning the memory data, as further described in detail below.

Figure 2:
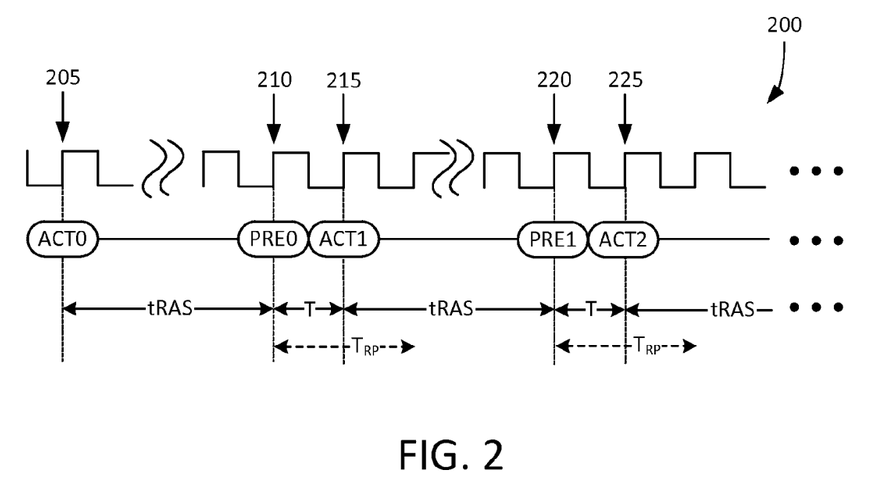
FIG. 2 is an example waveform timing diagram showing a particular sequence of memory-related events in accordance with embodiments of the inventive concept.

FIG. 2 is an example waveform timing diagram 200 showing a particular sequence of memory-related events in accordance with embodiments of the inventive concept. Referring to FIGS. 1 and 2, the control logic section 130 (of FIG. 1) can cause an activate command ACT0 at 205. The activate command can cause data to be read and moved from memory cells (e.g., MC 30 of FIG. 1) to the sense amplifier(s) (e.g., 150 of FIG. 1). The process of reading the data from the memory cells is destructive. In other words, the data is destroyed or erased. After a $T_{RAS}$, the control logic section 130 can cause a precharge command PRE0 at 210. The precharge command can close the current memory row and/or page and write back the data from the sense amplifer(s) (e.g., 150 of FIG. 1) to the memory cells (e.g., MC 30 of FIG. 1). The defresh logic section 135 (of FIG. 1) can be configured to violate, by an activate command ACT1 at 215, a $T_{RP}$ to clean the memory data for that particular row. In other words, the precharge command (e.g., PRE0) can be cut short so that the data is not written back from the sense amplifier(s) to the memory cells. Put differently, the next pages can be activated earlier than usual (i.e., earlier than $T_{RAS}+T_{RP}$), such that no page is closed properly, and thus, the contents in the memory cells would not hold any real data. This technique can be repeated for each of the rows 115 (of FIG. 1) to clean the data from the memory cell array 110 (of FIG. 1). For example, after the precharge command PRE1 at 220, the defresh logic section 135 can violate, by an activate command ACT2 at 225, the $T_{RP}$ for the associated memory row to clean the memory data for that particular row, and so forth.

Figure 3:
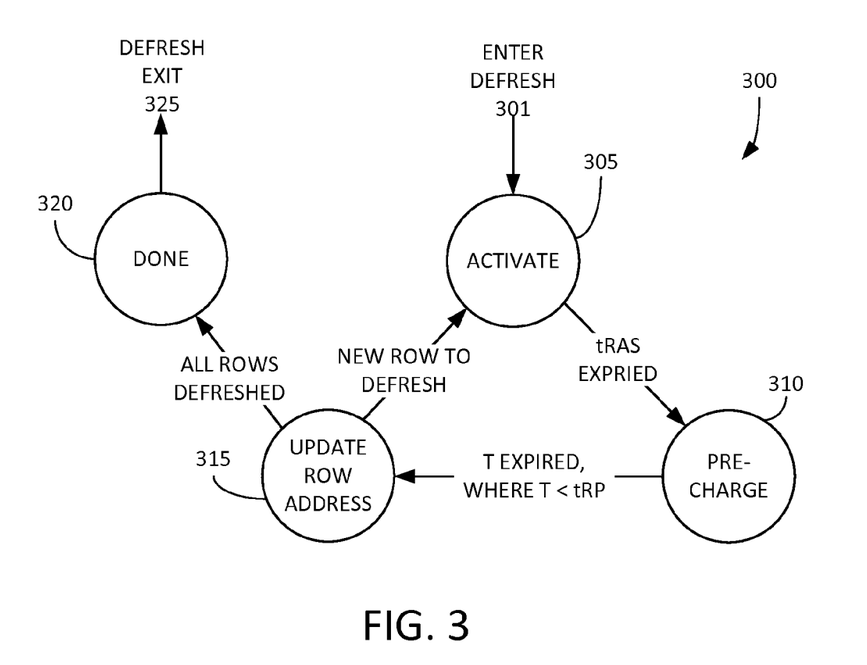
FIG. 3 is an example state machine diagram related to the waveform timing diagram of FIG. 2 in accordance with embodiments of the inventive concept.

FIG. 3 is an example state machine diagram 300 related to the waveform timing diagram 200 of FIG. 2 in accordance with embodiments of the inventive concept. Reference is now made to FIGS. 1, 2, and 3.

The defresh state can be entered at 301 responsive to either a memory reset, a memory power-on, or both. At 305, an activate command (e.g., ACT0) can be executed and the $T_{RAS}$ time period begins. After the $T_{RAS}$ time expires and the precharge command (e.g., PRE0) at 310 can be started, and the defresh counter 140 (of FIG. 1) can begin counting a time T at substantially a start time of the $T_{RP}$. The defresh counter 140 can end counting the time T before an end time of the $T_{RP}$. In other words, T can be less than $T_{RP}$. Responsive to the expiration of T, the control logic 130 (of FIG. 1) can cause the address decoder 120 (of FIG. 1) to update a row address at 315 associated with one of the rows 115 (of FIG. 1).

Alternatively, a counter need not be used. For example, a delay logic can be used, and at an end of a delay caused by the delay logic, the address decoder 120 (of FIG. 1) can update a row address at 315 associated with one of the rows 115 (of FIG. 1). Alternatively or in addition, the $T_{RP}$ can be completely removed, and pre-charging can move to the next line.

The control logic 130 can cause the activate command (ACT1 of FIG. 2) to violate the $T_{RP}$ at 305 after the row address is updated at 315, and responsive to the expiration of the time T. In this manner, a new row from among the rows 115 can be defreshed. The control logic section 130 and/or the defresh logic section 135 can violate the $T_{RP}$ for each of the rows 115 responsive to a memory reset, a memory power-on, or both. When all of the rows 115 have been defreshed, the state can transition to done at 320, and the defresh state exited at 325.

Figure 4:
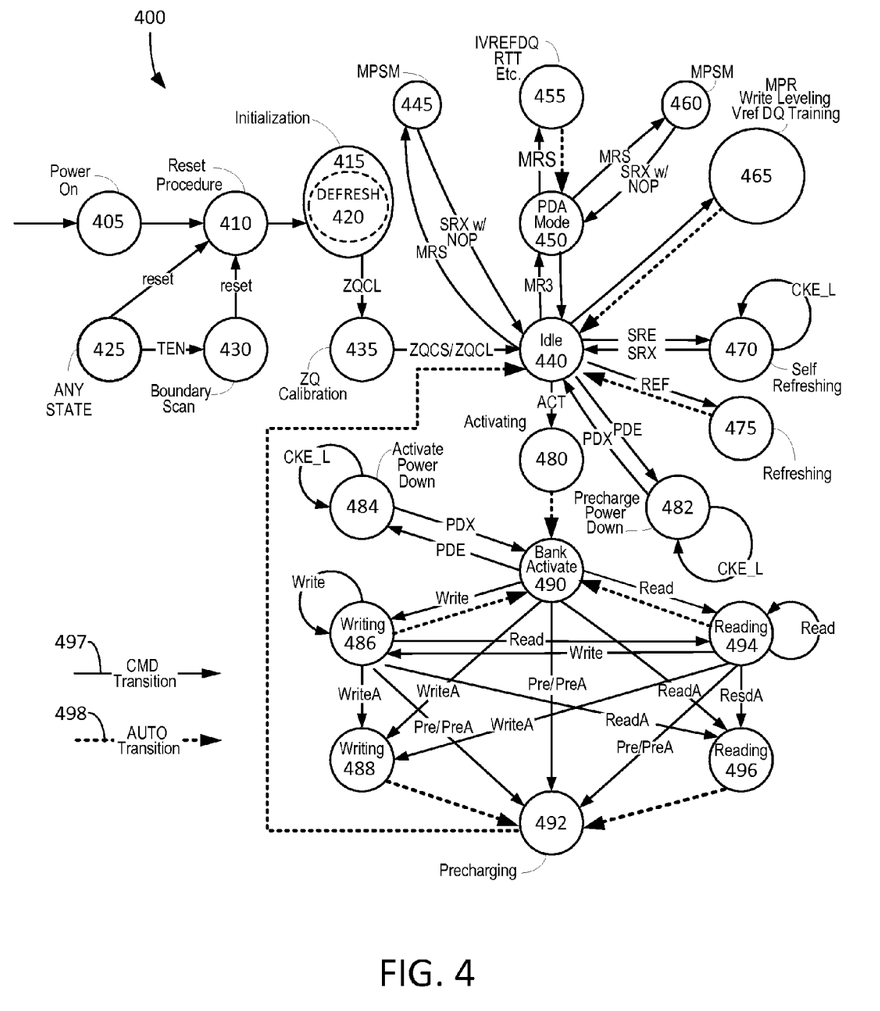
FIG. 4 is an example state machine diagram of a volatile memory including a defresh state within an initialization state in accordance with embodiments of the inventive concept.

FIG. 4 is an example state machine diagram 400 of a volatile memory (e.g., 105 of FIG. 1) including a defresh state 420 within an initialization state 415 in accordance with embodiments of the inventive concept. As shown, solid lines 497 indicate CMD transitions, or in other words, transitions that are initiated by a command, whereas the broken lines 498 indicate AUTO transitions, or in other words, transitions that are automatically initiated. The initial state can be the power on state 405, which transitions to a reset procedure 410. The reset procedure 410 state can also be arrived at from a boundary scan 430 or any other state 425. The reset procedure 410 transitions to the initialization state 415. The initialization state 415 can include the defresh state 420, as described in detail herein, to clean the memory data from the volatile memory device. The initialization state 415 transitions to a ZQ calibration state 435, and from there, to an idle state 440. The volatile memory can transition into and out of the idle state 440. For example, the idle state 440 can transition to and from states 445, 450, 465, 470, 475, 480, and/or 482. State 450 can transition to and from states 455 and/or 460. State 480 can transition to a bank activate state 490.

The bank activate state 490 can transition to and from an activate power down state 484, a writing state 486, and/or a reading state 494. The bank activate state 490 can transition to the precharging state 492, the writing state 488, and/or the reading state 496. Various transitions can occur among and between the bank activate state 490, the precharging state 492, the writing state 486, the reading state 494, the writing state 488, and/or the reading state 496. In addition, a transition can occur to return to the idle state 440.

Figure 5:
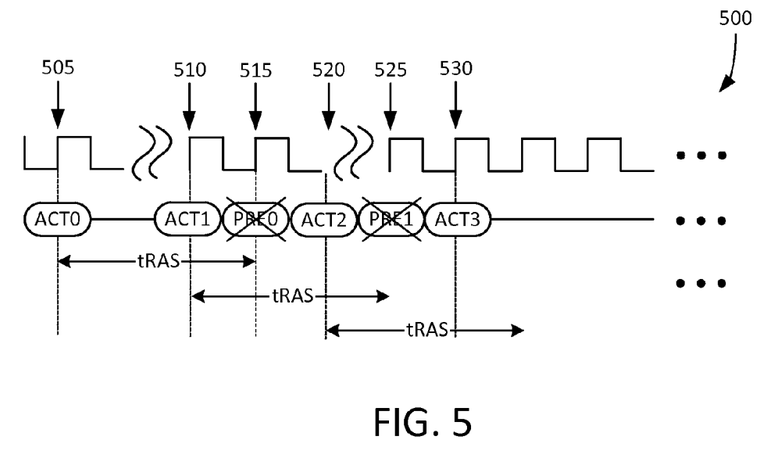
FIG. 5 is another example waveform timing diagram showing a particular sequence of memory-related events in accordance with embodiments of the inventive concept.

FIG. 5 is another example waveform timing diagram 500 showing a particular sequence of memory-related events in accordance with embodiments of the inventive concept.

Referring to FIGS. 1 and 5, the control logic section 130 (of FIG. 1) can cause a first activate command ACT0 at 505. A first $T_{RAS}$ can begin at substantially a same time 505 as activating the row (e.g., from among rows 115 of FIG. 1) that is associated with the activate command ACT0. The control logic section 130 can cause a second activate command ACT1 at 510 before an end time of the first $T_{RAS}$ and before a precharge PRE0 can be initiated at 515 for a second row, thereby violating the first $T_{RAS}$ and preventing the precharge PRE0 from occurring at 515. The control logic section 130 can cause a third row to be activated (ACT2) at 520 before an end time of a second $T_{RAS}$ and before a precharge PRE1 can be initiated at 525 for a third row, thereby violating the second $T_{RAS}$ and preventing the precharge PRE1 from occurring at 525. This technique can be repeated for each of the rows 115 (of FIG. 1) to clean the data from the memory cell array 110 (of FIG. 1).

Accordingly, next pages are activated earlier than the usual $T_{RAS}+T_{RP}$ timeframe, such that no page would be closed properly, thereby cleaning the data from the memory cell array. Since there is no need to spend time waiting for and performing precharges, the defresh procedure can be completed well within the duration of the initialization routine. The control logic section 130 can keep track of how many rows are invalidated, so that the entire DRAM can be invalidated (i.e., cleaned) if needed.

Figure 6:
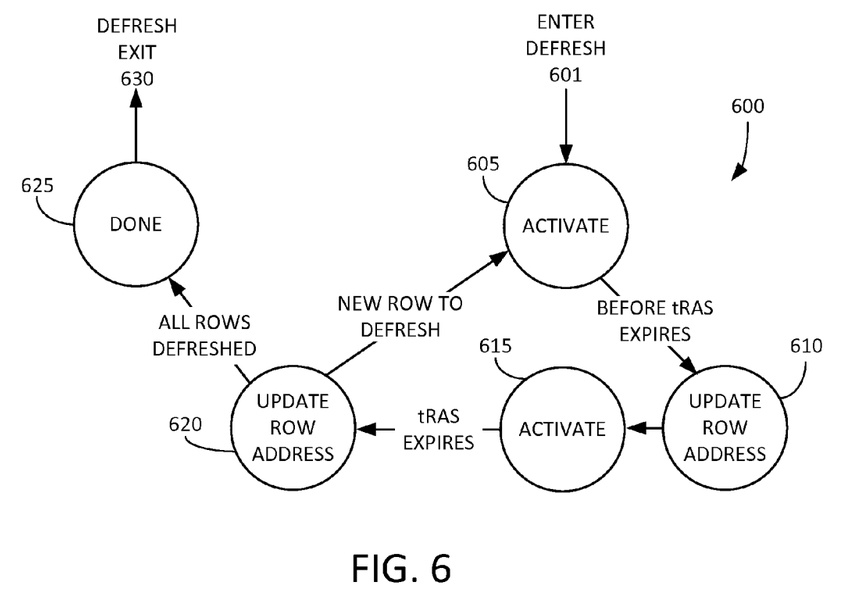
FIG. 6 is an example state machine diagram related to the waveform timing diagram of FIG. 5 in accordance with embodiments of the inventive concept.

FIG. 6 is an example state machine diagram 600 related to the waveform timing diagram of FIG. 5 in accordance with embodiments of the inventive concept. Reference is now made to FIGS. 1, 5, and 6.

The defresh state can be entered at 601 responsive to either a memory reset, a memory power-on, or both. At 605, an activate command (e.g., ACT0) can be executed and the $T_{RAS}$ time period can begin. The activate command can move data from memory cells (e.g., MC 30 of FIG. 1) to the sense amplifier(s) (e.g., 150 of FIG. 1). Before the $T_{RAS}$ time expires and before the precharge command (e.g., PRE0) at 515 (of FIG. 5) can be started, the control logic 130 (of FIG. 1) can cause the address decoder 120 (of FIG. 1) to update a row address at 610, after which a new row can be activated (e.g., ACT1) at 615, thereby violating the $T_{RAS}$ and preventing the precharge command (e.g., PRE0) from occurring at 515 (of FIG. 5). The memory data is therefore cleaned from this particular row. The control logic 130 (of FIG. 1) can ensure that the charges in the associated capacitors of the memory cells are completely discharged so as to ensure that the data is entirely wiped clean. After the new row (e.g., ACT1) is activated at 615, the $T_{RAS}$ can expire, and the control logic 130 can cause the address decoder 120 to update the row address at 620.

The control logic 130 can cause the next activate command (e.g., ACT2 of FIG. 5) to be executed at 605 and to violate the $T_{RAS}$ at 520 (of FIG. 5) after the row address is updated at 620. In this manner, a series of and/or all of rows from among the rows 115 can be defreshed. The control logic section 130 and/or the defresh logic section 135 can violate the $T_{RAS}$ for each of the rows 115 responsive to a memory reset, a memory power-on, or both. When all of the rows 115 have been defreshed, the state can transition to done at 625, and the defresh state exited at 630.

Figure 7:
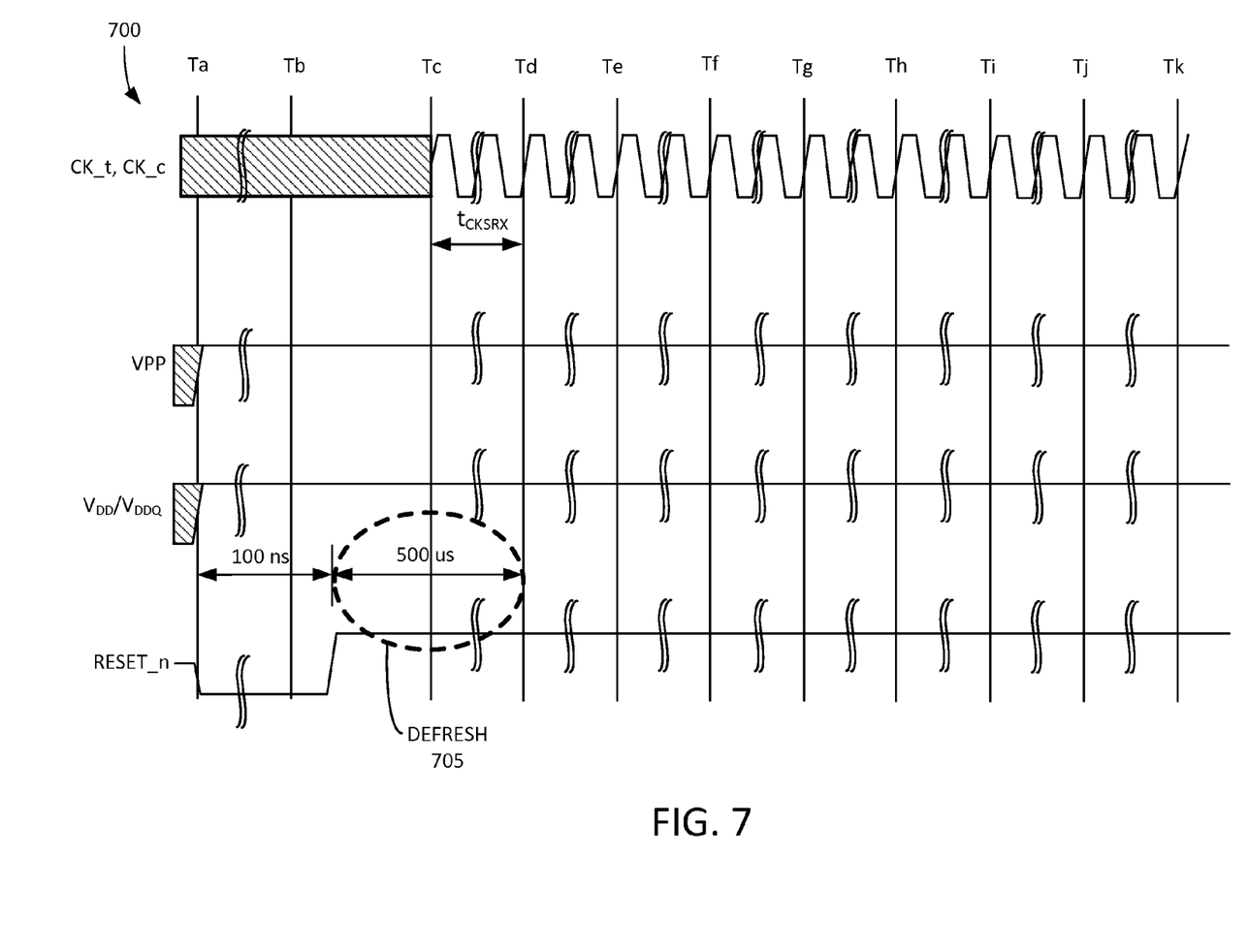
FIG. 7 is an example waveform timing diagram of a power-up initialization sequence of a volatile memory including a defresh logic section in accordance with embodiments of the inventive concept.

FIG. 7 is an example waveform timing diagram 700 of a power-up initialization sequence of a volatile memory (e.g., 105 of FIG. 1) including a defresh logic section (e.g., 135) in accordance with embodiments of the inventive concept. In the event of a power-on, RESET_n is maintained for a period of time, e.g., at least 200 microseconds (μs), with stable power. After RESET_n is de-asserted, another period of time (e.g., 500 μs) is waited until CKE becomes active. During this time, the DRAM starts internal initialization, which can be done independency of external clocks. The defresh logic section 135 can cause the defresh procedure 705 to occur during the internal initialization. The defresh procedure 705 can occupy some or all of the time devoted to the internal initialization.

Figure 8:
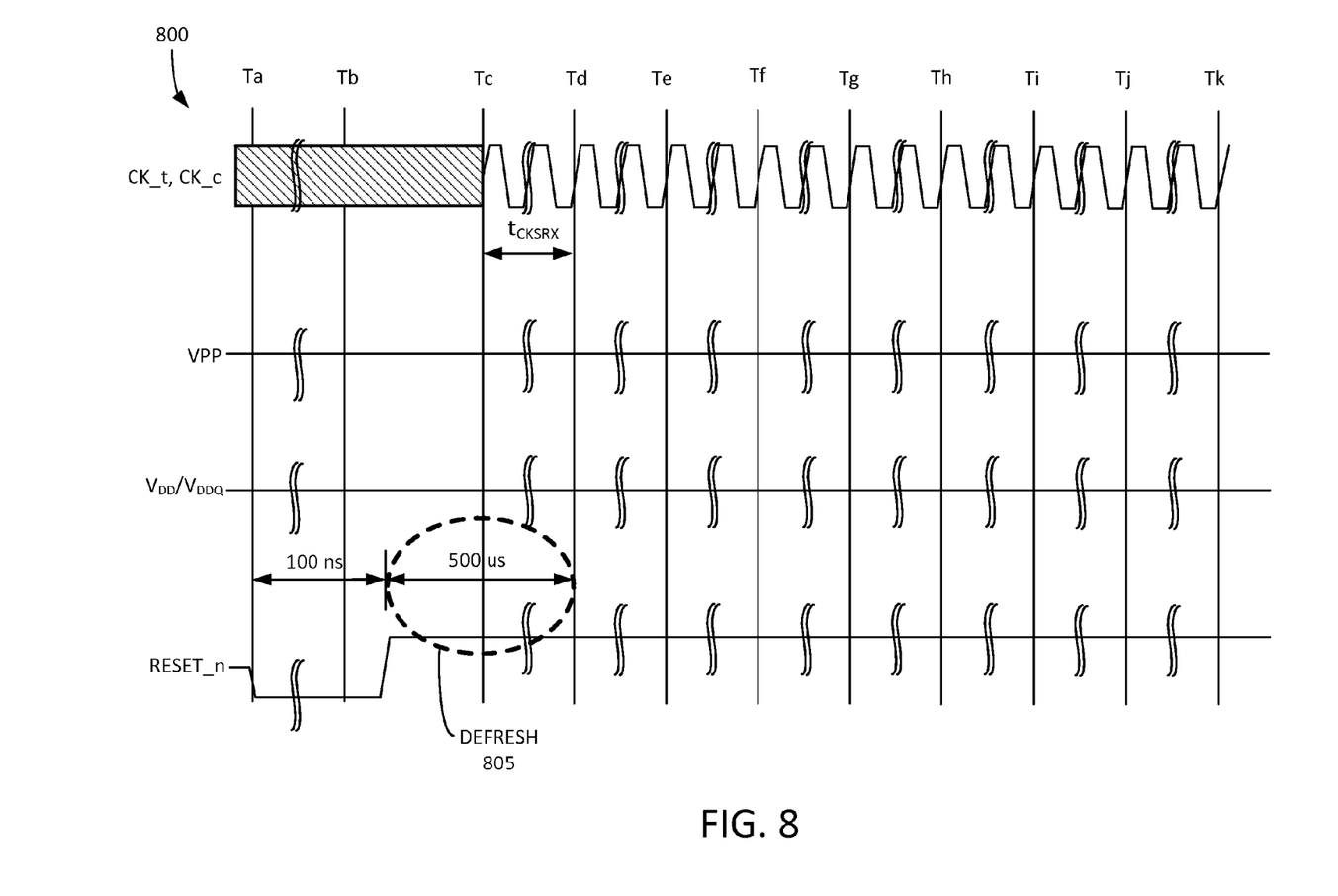
FIG. 8 is an example waveform timing diagram of a reset initialization sequence of a volatile memory including a defresh logic section in accordance with embodiments of the inventive concept.

FIG. 8 is an example waveform timing diagram 800 of a reset initialization sequence of a volatile memory (e.g., 105 of FIG. 1) including a defresh logic section (e.g., 135) in accordance with embodiments of the inventive concept. In the event of a reset, without necessarily a power-on, RESET_n is maintained for at least tPW_RESET, e.g., 100 nanoseconds (ns). After RESET_n is de-asserted, another period of time (e.g., 500 μs) is waited until CKE becomes active. During this time, the DRAM starts internal initialization, which can be done independency of external clocks. The defresh logic section 135 can cause the defresh procedure 805 to occur during the internal initialization. The defresh procedure 805 can occupy some or all of the time devoted to the internal initialization.

Figure 9:
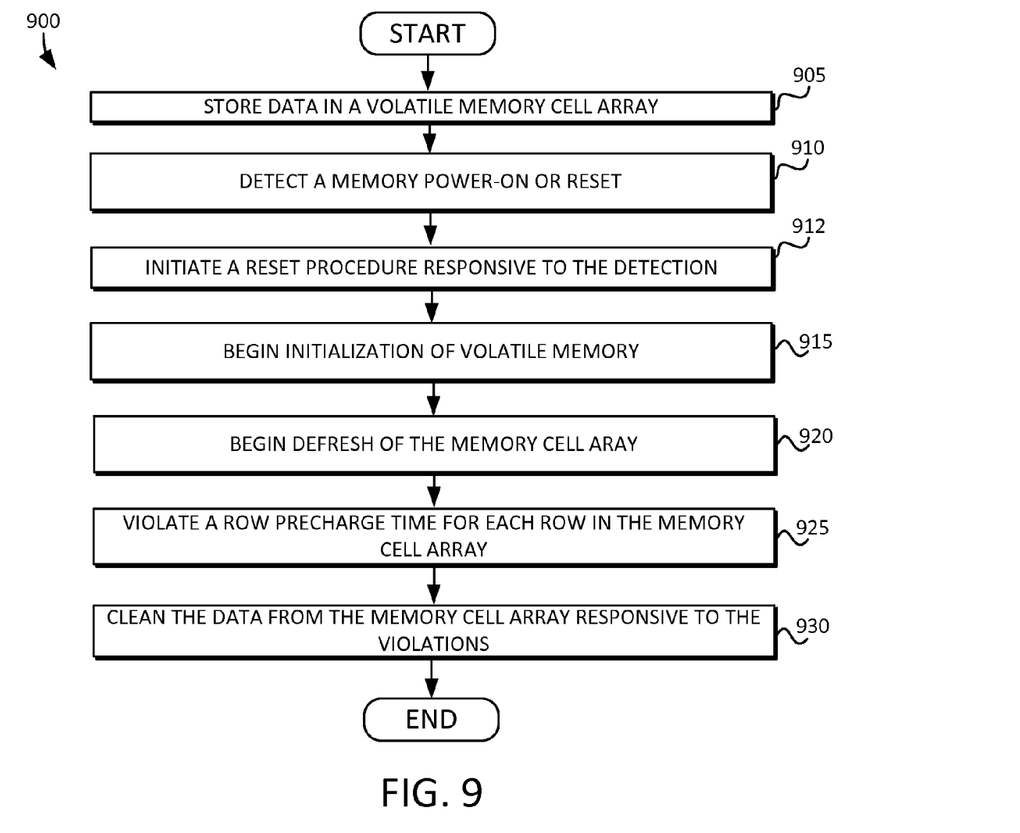
FIG. 9 illustrates a flow diagram including a technique for defreshing a volatile memory in accordance with embodiments of the inventive concept.

FIG. 9 illustrates a flow diagram 900 including an example technique for defreshing a volatile memory (e.g., 105 of FIG. 1) in accordance with embodiments of the inventive concept. The technique begins at 905, where data is stored in a volatile memory cell array. More specifically, data can be stored in multiple rows (e.g., 115 of FIG. 1) of a memory cell array (e.g., 110 of FIG. 1) of the volatile memory 105. At 910, a memory power-on and/or memory reset of the volatile memory 105 can be detected. At 912, a reset procedure can be initiated responsive to the detection. At 915, an initialization of the volatile memory can begin responsive to the reset procedure. The initializing can include beginning defreshing at 920 the multiple rows 115 of the memory cell array 110 by a defresh logic section (e.g., 135 of FIG. 1).

Defreshing can include violating at 925 a $T_{RP}$ for each of the rows 115, and cleaning at 930 the data from the rows 115 of the memory cell array 110 responsive to the violations. For example, a defresh counter (e.g., 140 of FIG. 1) can begin counting a time T at substantially a start time of the $T_{RP}$, and end counting the time T before an end time of the $T_{RP}$. The time T can be less than the $T_{RP}$. A row address associated with each iterative row 115 can be updated responsive to the expiration of the time T, and the defresh logic section 135 can cause an activate command (e.g., ACT1 of FIG. 2) to intentionally violate the $T_{RP}$ after updating the row address and responsive to the expiration of the time T.

Steps 920 through 930 can be repeated for every row in memory, after which a signal can be provided to the DRAM that it is out of an initialization sequence, after which new commands (e.g., reads or writes) can be replied to. It will be understood that the steps need not occur in the illustrated order, but rather, can occur in a different order and/or with intervening steps.

Figure 10:
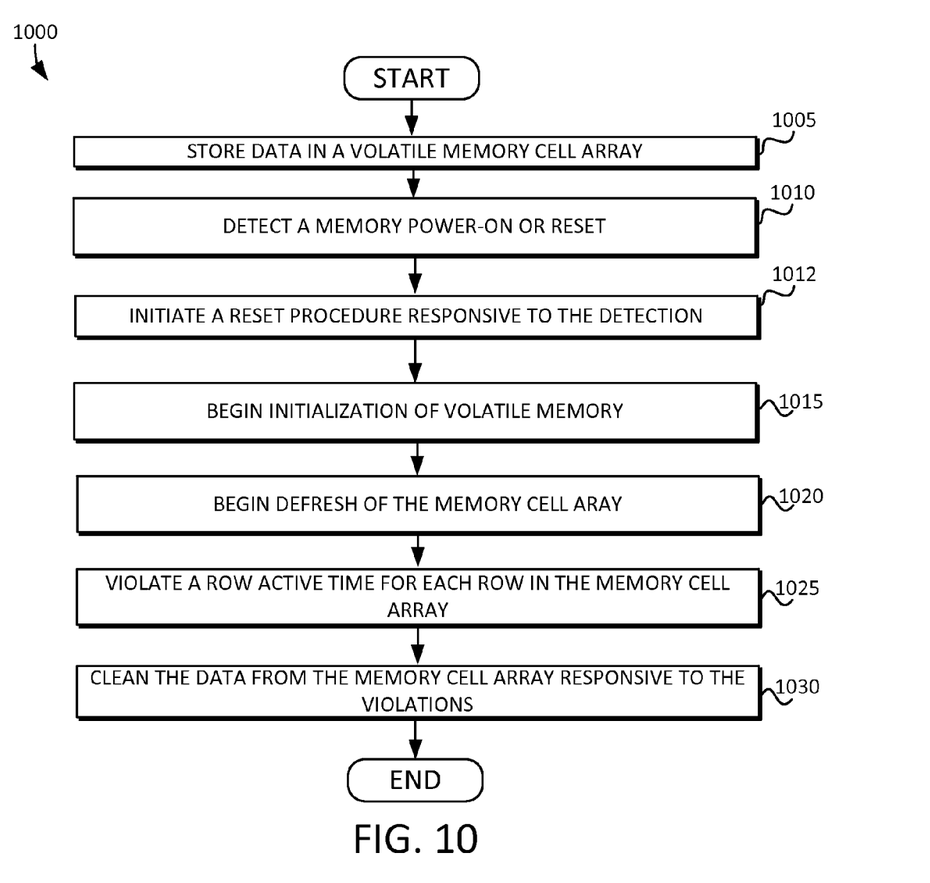
FIG. 10 illustrates a flow diagram including another example technique for defreshing a volatile memory in accordance with embodiments of the inventive concept.

FIG. 10 illustrates a flow diagram 1000 including another example technique for defreshing a volatile memory (e.g., 105 of FIG. 1) in accordance with embodiments of the inventive concept. The technique begins at 1005 where data can be stored in a volatile memory cell array. More specifically, data can be stored in multiple rows (e.g., 115 of FIG. 1) of a memory cell array (e.g., 110 of FIG. 1) of the volatile memory 105. At 1010, a memory power-on and/or memory reset of the volatile memory 105 can be detected. At 1012, a reset procedure can be initiated responsive to the detection. At 1015, an initialization of the volatile memory can begin responsive to the reset procedure. The initializing can include beginning defreshing at 1020 the multiple rows 115 of the memory cell array 110 by a defresh logic section (e.g., 135 of FIG. 1).

Defreshing can include violating at 1025 a $T_{RAS}$ for each of the rows 115, and cleaning at 1030 the data from the rows 115 of the memory cell array 110 responsive to the violations. For example, a row address associated with each iterative row 115 can be iteratively updated. A first row from among the rows 115 can be activated, and a first $T_{RAS}$ can begin at substantially a same time as activating the first row. A second row from among the rows 115 can be activated (e.g., ACT1 of FIG. 5) before an end time of the first $T_{RAS}$ and before a precharge is initiated for the first row. The first $T_{RAS}$ timing can be intentionally violated by the second row activation. A third row from among the rows 115 can be activated (e.g., ACT2 of FIG. 5) before an end time of a second $T_{RAS}$ and before a precharge is initiated for the second row. Consequently, the second $T_{RAS}$ can be intentionally violated by the third row activation, and so forth. The memory data can therefore be cleaned from the multiple rows 115 of the memory cell array 110 of the volatile memory 105 responsive to the violations.

It will be understood that the steps need not occur in the illustrated order, but rather, can occur in a different order and/or with intervening steps.

Figure 11:
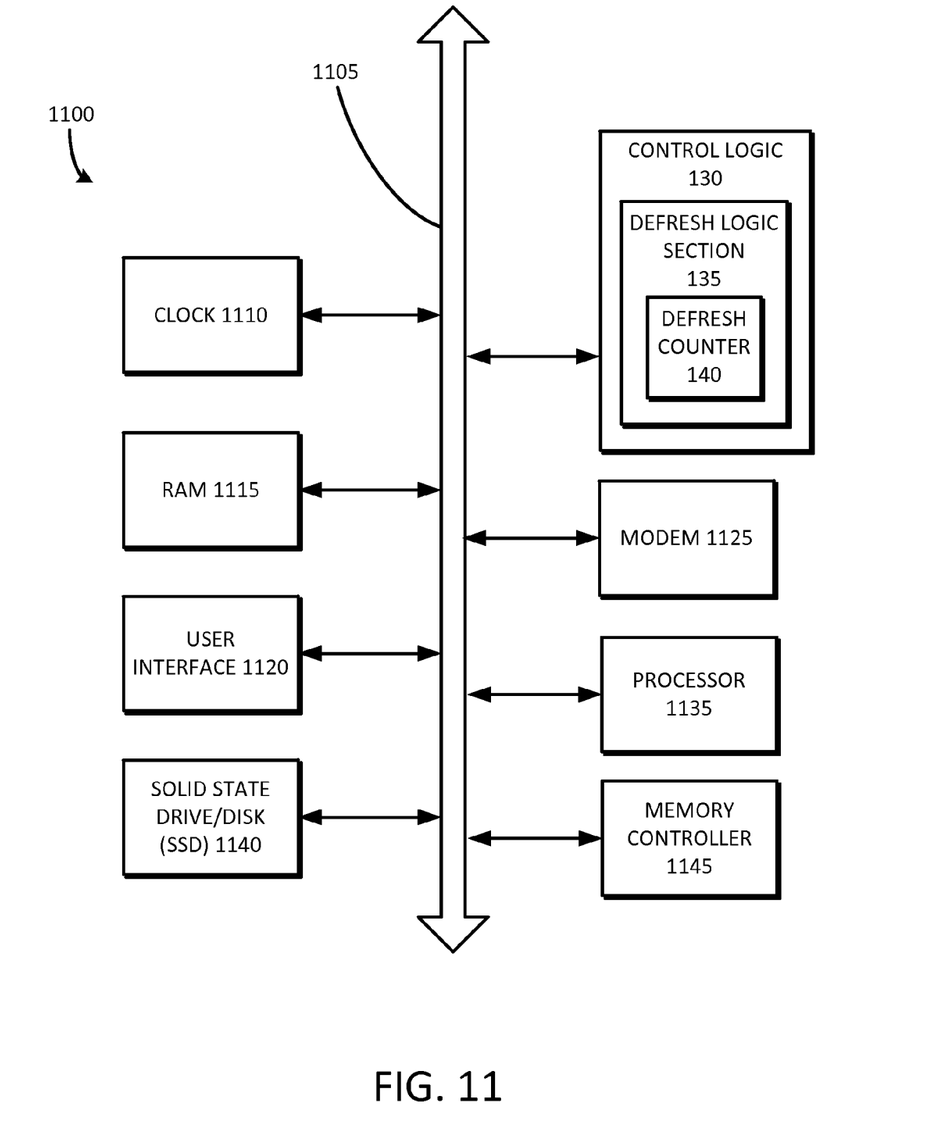
FIG. 11 is a block diagram of a computing system including the control logic and defresh logic as described in detail with reference to FIGS. 1-10 above.

FIG. 11 is a block diagram of a computing system 1100 including the control logic section 130 and defresh logic section 135 as described in detail with reference to FIGS. 1-10 above. Referring to FIG. 11, the computing system 1100 may include a clock 1110, a random access memory (RAM) 1115, a user interface 1120, a modem 1125 such as a baseband chipset, a solid state drive/disk (SSD) 1140, a memory controller 1145, and/or a processor 1135, any or all of which may be electrically coupled to a system bus 1105. The control logic section 130 can correspond to that described in detail above, and as set forth herein, and may also be electrically coupled to the system bus 1105. The control logic section 130 can include or otherwise interface with the clock 1110, the random access memory (RAM) 1115, the user interface 1120, the modem 1125, the solid state drive/disk (SSD) 1140, the memory controller 1145, and/or the processor 1135.

Accordingly, a reset command and/or power-on can initiate a defresh process. The defresh can be based on the DRAM self-refresh mechanism, but uses alternative timing. For example, every DRAM page can be activated, thereby destroying the individual charges of each capacitor within the memory cells, and in addition, intentionally violate the precharge timing so that there is not enough time to restore the charges. Consequently, the data stored in the memory pages is destroyed. The control logic can enforce the new timing and ensure that all rows are destroyed before the rest process is allowed to finish, after which, the DRAM can start accepting new commands.

In an alternative embodiment, a similar or same mechanism can be used to initialize the DRAM to a predefined value instead of destroying the content. For example, an initial-to-zero can be performed of all DRAM cells responsive to a memory reset and/or a memory power-on. In this embodiment, the time to completion would be longer than the flush because full timing would need to be respected to correctly precharge the rows. On the other hand, the alternative embodiment provides the ability to initialize the DRAM to the predefined value in place of offloading such work to, for example, an operation system. Such approach is more advantageous and efficient relative to a purely software-based solution performed higher in the stack.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the inventive concept with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the inventive concept may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:
1. A volatile memory device, comprising:
a memory cell array including a plurality of rows configured to store data;
an address decoder coupled to the memory cell array; and
a control logic section coupled to the address decoder, the control logic section including a defresh logic section configured to violate, by an activate command, a row precharge time ($T_{RP}$) for each of the plurality of rows to clean the data from the memory cell array.

2. The volatile memory device of claim 1, wherein the defresh logic section is configured to violate the $T_{RP}$ for each of the plurality of rows responsive to a memory reset.

3. The volatile memory device of claim 1, wherein the defresh logic section is configured to violate the $T_{RP}$ for each of the plurality of rows responsive to a memory power-on.

4. The volatile memory device of claim 1, further comprising delay logic, wherein the address decoder is configured to update a row address associated with one of the plurality of rows after a delay caused by the delay logic.

5. The volatile memory device of claim 1, wherein the defresh logic section includes a defresh counter that is configured to begin counting a time T at substantially a start time of the $T_{RP}$ and end counting the time T before an end time of the $T_{RP}$.

6. The volatile memory device of claim 5, wherein the address decoder is configured to update a row address associated with one of the plurality of rows responsive to an expiration of the time T.

7. The volatile memory device of claim 6, wherein the control logic section is configured to cause the activate command to violate the $T_{RP}$ after the row address is updated and responsive to the expiration of the time T.

8. The volatile memory device of claim 7, wherein the time T is less than the $T_{RP}$.

9. A computer-implemented method for defreshing a volatile memory, the method comprising:
   storing data in a plurality of rows of a memory cell array of the volatile memory;
   detecting at least one of a memory power-on or a memory reset of the volatile memory;
   initiating a reset procedure responsive to the detecting;
   initializing the volatile memory responsive to the reset procedure, wherein initializing includes defreshing, by a defresh logic section, the plurality of rows of the memory cell array of the volatile memory, wherein defreshing includes:
      violating, by an activate command, a row precharge time ($T_{RP}$) for each of the plurality of rows; and
      cleaning the data from the plurality of rows of the memory cell array responsive to the violations.

10. The computer-implemented method of claim 9, further comprising:
   violating, by the defresh logic section, the $T_{RP}$ for each of the plurality of rows responsive to the memory reset.

11. The computer-implemented method of claim 9, further comprising:
   violating, by the defresh logic section, the $T_{RP}$ for each of the plurality of rows responsive to the memory power-on.

12. The computer-implemented method of claim 9, further comprising:
   beginning counting, by a defresh counter of the defresh logic section, a time T at substantially a start time of the $T_{RP}$; and
   ending counting, by the defresh counter, the time T before an end time of the $T_{RP}$.

13. The computer-implemented method of claim 12, wherein the time T is less than the $T_{RP}$.

14. The computer-implemented method of claim 12, further comprising:
   updating, by an address decoder, a row address associated with one of the plurality of rows responsive to an expiration of the time T.

15. The computer-implemented method of claim 14, further comprising:
   causing, by the defresh logic section, the activate command to violate the $T_{RP}$ after updating the row address and responsive to the expiration of the time T.

16. A computer-implemented method for defreshing a volatile memory, the method comprising:
   storing data in a plurality of rows of a memory cell array of the volatile memory;
   detecting at least one of a memory power-on or a memory reset of the volatile memory;
   initiating a reset procedure responsive to the detecting;
   initializing the volatile memory responsive to the reset procedure, wherein initializing includes defreshing, by a defresh logic section, the plurality of rows of the memory cell array of the volatile memory, wherein defreshing includes:
      activating a first row from among the plurality of rows;
      beginning a first row active time ($T_{RAS}$) at substantially a same time as activating the first row;
      activating a second row from among the plurality of rows before an end time of the first $T_{RAS}$ and before a precharge is initiated for the first row;
      violating, by the second row activation, the first $T_{RAS}$;
      activating a third row from among the plurality of rows before an end time of a second $T_{RAS}$ and before a precharge is initiated for the second row;
      violating, by the third row activation, the second $T_{RAS}$;
      cleaning the data from the plurality of rows of the memory cell array responsive to the violations.

17. The computer-implemented method of claim 16, further comprising:
   violating, by the defresh logic section, the $T_{RAS}$ for each of the plurality of rows responsive to the memory reset.

18. The computer-implemented method of claim 16, further comprising:
   violating, by the defresh logic section, the $T_{RAS}$ for each of the plurality of rows responsive to the memory power-on.

19. The computer-implemented method of claim 16, further comprising:
   updating, by an address decoder, a row address, after activating the first row; and
   updating, by the address decoder, the row address, after activating the second row.

20. The computer-implemented method of claim 19, further comprising:
   causing, by the defresh logic section, the activation of the second and third rows to violate the first $T_{RAS}$ and the second $T_{RAS}$, respectfully.

* * * * *